(12) United States Patent
Takahashi

(10) Patent No.: US 7,709,898 B2
(45) Date of Patent: May 4, 2010

(54) SEMICONDUCTOR PROTECTION CIRCUIT, METHOD FOR FABRICATING THE SAME AND METHOD FOR OPERATING SEMICONDUCTOR PROTECTION CIRCUIT

(75) Inventor: Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 193 days.

(21) Appl. No.: 11/902,395

(22) Filed: Sep. 21, 2007

(65) Prior Publication Data

US 2008/0197416 A1 Aug. 21, 2008

(30) Foreign Application Priority Data

Feb. 21, 2007 (JP) ............... 2007-040770

(51) Int. Cl.
*H01L 23/62* (2006.01)
(52) U.S. Cl. ............ 257/357; 257/355; 257/173; 257/E27.016; 257/E29.008; 257/E29.019
(58) Field of Classification Search ............ 257/173, 257/355–357, 546, E27.016, E29.008, E29.013, 257/E29.019; 351/91.5, 100
See application file for complete search history.

(56) References Cited

U.S. PATENT DOCUMENTS

| | | | |
|---|---|---|---|
| 5,349,227 A * | 9/1994 | Murayama | 257/361 |
| 5,416,351 A * | 5/1995 | Ito et al. | 257/357 |
| 5,541,801 A * | 7/1996 | Lee et al. | 361/56 |
| 6,117,714 A | 9/2000 | Beatty | |
| 6,337,502 B1 | 1/2002 | Eitan et al. | |
| 6,337,593 B1 * | 1/2002 | Mizuno et al. | 327/534 |
| 6,337,787 B2 * | 1/2002 | Tang | 361/56 |
| 6,469,325 B1 * | 10/2002 | Ishizuka et al. | 257/173 |
| 6,621,108 B2 * | 9/2003 | Tashiro et al. | 257/173 |
| 7,280,329 B2 * | 10/2007 | Kim et al. | 361/56 |
| 7,420,250 B2 * | 9/2008 | Lee et al. | 257/355 |

* cited by examiner

*Primary Examiner*—Anh Phung
*Assistant Examiner*—Allison P Bernstein
(74) *Attorney, Agent, or Firm*—McDermott Will & Emery LLP

(57) ABSTRACT

A protection circuit protects a semiconductor device provided on a semiconductor substrate and including an interconnect from charge entering the interconnect during fabrication of the semiconductor device. The protection circuit includes a first metal interconnect connected to the interconnect; a forward diode and a backward diode connected in parallel to the interconnect; an NMIS whose drain is connected to the output port of the forward diode, whose source is connected to the semiconductor substrate and whose gate is grounded through an upper metal interconnect; a PMIS whose drain is connected to the input port of the backward diode and whose source is connected to the semiconductor substrate; a first antenna connected to the gate of the NMIS; and a second antenna connected to the gate of the PMIS.

6 Claims, 16 Drawing Sheets

SEMICONDUCTOR PROTECTION CIRCUIT, METHOD FOR FABRICATING THE SAME AND METHOD FOR OPERATING SEMICONDUCTOR PROTECTION CIRCUIT

BACKGROUND OF THE INVENTION

The present invention relates to a semiconductor protection circuit of a semiconductor device, and more particularly, it relates to a circuit for protecting a device from charge entering an interconnect such as a word line provided in a nonvolatile semiconductor memory, and a method for operating the same.

In accordance with recently increased degree of integration and reduced cost of a nonvolatile semiconductor memory, a MONOS (metal-oxide-nitride-oxide-silicon) memory technique in which a virtual ground type array is used and charge is locally trapped in an insulating film disposed beneath a gate electrode has been proposed.

In a MONOS memory, when a high (positive or negative) voltage is applied to a word line owing to charge generated during the fabrication, the threshold voltage of a memory cell is varied, and therefore, it is necessary to provide a circuit for protecting a word line or a charge trapping layer from the charge generated during the fabrication.

Now, a conventional semiconductor protection circuit will be described with reference to drawings.

First, a first conventional technique will be described (see U.S. Pat. Nos. 6,337,502 and 6,117,714). A conventional MONOS memory includes a plurality of memory cells arranged in the form of a matrix; word lines provided correspondingly to the rows of the memory cells and respectively connected to gate electrodes of MONOS structures included in the corresponding memory cells; bit lines provided correspondingly to the columns of the memory cells and respectively connected to impurity diffusion layers of the corresponding memory cells; an X decoder for driving the word lines; a Y decoder connected to the bit lines; and a sense amplifier for amplifying a signal read by the Y decoder. Each memory cell includes a P-type well formed in a P-type substrate; a charge trapping layer and a word line electrode successively formed on the P-type well in this order in the upward direction; N-type diffusion layers formed in the P-type well on both sides of the charge trapping layer; a word line formed above the word line electrode and made of a first layer metal interconnect; and a contact for connecting the word line electrode and the first layer metal interconnect. The bit line is connected to the N-type diffusion layer (i.e., the source or drain) of the memory cell.

FIG. 13 is a circuit diagram of a conventional semiconductor protection circuit. It is noted that this drawing shows a state attained during the fabrication, and specifically, it shows a state of the conventional semiconductor protection circuit attained after forming a first layer metal interconnect 1012. As shown in FIG. 13, the first layer metal interconnect 1012 for connecting a word line of a memory cell and an X decoder is connected to the drain of an N-channel MOS transistor 1102 (hereinafter referred to as the NMOS 1102) disposed in a P-type well PW. The drain of the NMOS 1102 also functions as an N-type diffusion layer included in a backward diode 1103. The source of the NMOS 1102 is grounded and the gate electrode thereof is connected to an antenna formed by using the first layer metal interconnect 1012 or the like.

FIG. 14 is a cross-sectional view of the conventional semiconductor protection circuit of FIG. 13. It is noted that this drawing shows a state thereof attained during the fabrication, and for example, it shows a state of the conventional semiconductor protection circuit attained during formation of a first layer metal interconnect 1012. As shown in FIG. 14, the conventional semiconductor protection circuit includes a P-type well 1003 provided in a P-type semiconductor substrate 1001; an isolation insulating film 1005 formed on the P-type well 1003; a gate insulating film 1008 and a gate electrode 1009b provided on the P-type well 1003; N-type diffusion layers 1007 including an N-type impurity and provided in the P-type well 1003 on both sides of the gate electrode 1009b; and a P-type diffusion layer 1006 formed on the P-type well 1003 to be in contact with one N-type diffusion layer 1007. A word line electrode 1009a of a memory cell is connected to the first layer metal interconnect 1012 through a contact 1011a and is connected to one N-type diffusion layer 1007 working as the drain of the NMOS 1102 through a contact 1011b. Since the other N-type diffusion layer 1007 working as the source of the NMOS 1102 is connected to the P-type diffusion layer 1006, it has the same potential as the P-type well 1003, namely, the ground potential.

FIG. 15 is a diagram for showing a method for protecting a memory cell from positive charge by the conventional semiconductor protection circuit. When positive charge enters the first layer metal interconnect 1012, the drain voltage of the NMOS 1102 is increased in the positive direction. Simultaneously, since the potential of the antenna 1104 connected to the gate of the NMOS 1102 is also increased in the positive direction, the NMOS 1102 is turned on, and hence, the drain and the source of the NMOS 1102 are connected to each other. Accordingly, the positive charge transferred to the drain of the NMOS 1102 can be drained to the ground. Specifically, when the threshold voltage of the NMOS 1102 is approximately 1 V, the potential increase of the word line electrode 1009a caused by positive charge can be suppressed to approximately 1 V.

FIG. 16 is a diagram for showing a method for protecting a memory cell from negative charge by the conventional semiconductor protection circuit. When negative charge enters the first layer metal interconnect 1012, the negative charge can be drained to the ground through the backward diode 1103.

FIG. 17 is a circuit diagram of the conventional semiconductor protection circuit obtained after completing the fabrication. The conventional semiconductor protection circuit is characterized by the gate electrode and the source of the NMOS 1102 being grounded.

FIG. 18 is a cross-sectional view of the conventional semiconductor protection circuit of FIG. 17 obtained after completing the fabrication. The word line electrode 1009a is connected to the first layer metal interconnect 1012 through the contact 1011a and is further connected to a second layer metal interconnect 1014 through a first via 1013a to be connected to the X decoder through the second layer metal interconnect 1014a. The gate electrode 1009b of the NMOS 1102 is connected to the first layer metal interconnect 1012 through a contact 1011c, is further connected to a second layer metal interconnect 1014b through a first via 1013b and is further connected to a third layer metal interconnect 1016 through a second via 1015, so as to be grounded through the vias and the contact.

In this manner, as a characteristic of this conventional technique, while the metal interconnect connected to a word line is being processed, the gate electrode 1009b is placed in a floating state connected to the antenna, and after completing the processing of the metal interconnect connected to a word line, the potential of the gate electrode 1009b is suppressed to the ground potential.

In a data write operation, a voltage of, for example, approximately +9 V is applied to a word line of the semiconductor memory. At this point, the NMOS 1102 is in an off state because its gate electrode is grounded, and hence, the voltage of 9 V applied to the word line is never dropped. Also, since a reverse voltage is applied to the backward diode 1103, no current passes, and hence, the applied voltage is never dropped by the conduction of the backward diode. Accordingly, the voltage of approximately +9 V can be applied to the word line of the memory cell 1101.

In a data delete operation, a voltage of approximately 0 V (substantially equal to the ground potential) is applied to the word line of the memory cell 1101. At this point, the NMOS 1102 is in an off state because its gate electrode is grounded, and hence, the voltage of 0 V applied to the word line is never changed. Also, since the same potential is applied to both ends of the backward diode 1103, the voltage applied to the word line is never changed by the conduction of the backward diode 1103. Accordingly, the voltage of approximately +0 V can be applied to the word line.

SUMMARY OF THE INVENTION

In the aforementioned conventional technique, however, negative potential cannot be applied to a word line of a memory cell. This is because when a negative voltage is applied to a word line of a memory cell, the negative voltage is drained to the ground through the backward diode.

The present invention was devised to overcome this conventional problem, and an object of the invention is realizing a semiconductor protection circuit having a high degree of freedom in a voltage that can be applied to a word line of a memory cell during an operation.

In order to achieve the object, the semiconductor protection circuit of this invention provided on a semiconductor substrate for protecting a semiconductor device including an interconnect from charge entering the interconnect during fabrication of the semiconductor device, includes a first metal interconnect connected to the interconnect and disposed on an upper layer than the interconnect; a forward diode having an input port connected to the interconnect; a backward diode that has an output port connected to the interconnect and is connected to the forward diode in parallel; an N-channel MIS transistor whose drain is connected to an output port of the forward diode, whose source is connected to the semiconductor substrate and whose gate electrode is grounded through a second metal interconnect disposed on an upper layer than the first metal interconnect; a P-channel MIS transistor whose drain is connected to an input port of the backward diode and whose source is connected to the semiconductor substrate; a first antenna connected to the gate electrode of the N-channel MIS transistor and disposed on the same interconnect layer as at least a part of the first metal interconnect; and a second antenna connected to a gate electrode of the P-channel MIS transistor and disposed on the same interconnect layer as at least a part of the first metal interconnect.

Owing to this structure, in the case where positive charge is generated during the fabrication of the semiconductor device, the positive charge can be drained to the ground (or the semiconductor substrate) through the forward diode and the N-channel MIS transistor, and in the case where negative charge is generated, the negative charge can be drained to the ground (or the semiconductor substrate) through the backward diode and the P-channel MIS transistor. Also, the interconnect of the semiconductor device can be driven in a wide voltage range from a positive voltage to a negative voltage by controlling a voltage to be applied to each constituting member by using a control circuit or the like. Accordingly, the semiconductor protection circuit of this embodiment is useful as a protection circuit of a semiconductor memory having an interconnect on which a voltage is large varied, such as a MONOS memory.

The semiconductor protection circuit of this invention may further include a third antenna connected to a second N-type well, so as to more effectively collect charge to be drained to the ground.

Furthermore, when a plurality of forward diodes are connected to a common N-channel MIS transistor and a plurality of backward diodes are connected to a common P-channel MIS transistor, the area of the semiconductor protection circuit can be reduced.

The method of this invention for fabricating a semiconductor protection circuit provided on a P-type semiconductor substrate for protecting a semiconductor device including an interconnect from charge entering the interconnect during fabrication of the semiconductor device, includes the steps of (a) forming a deep N-type well in the semiconductor substrate and successively forming a first P-type well, a second P-type well, a first N-type well and a second N-type well in the deep N-type well; (b) forming a forward diode in the first N-type well, forming a backward diode in the first P-type well, forming an N-channel MIS transistor on the second P-type well and forming a P-channel MIS transistor on the second N-type well; (c) forming, above the semiconductor substrate, a first layer metal interconnect including a first metal interconnect for mutually connecting the interconnect, an input port of the forward diode and an output port of the backward diode, a second metal interconnect for connecting a drain of the N-channel MIS transistor and an output port of the forward diode, a third metal interconnect for connecting a source of the N-channel MIS transistor to the semiconductor substrate, a fourth metal interconnect for connecting an input port of the backward diode and a drain of the P-channel MIS transistor and a fifth metal interconnect for connecting a source of the P-channel MIS transistor to the semiconductor substrate; a first antenna connected to a gate electrode of the N-channel MIS transistor and a second antenna connected to a gate electrode of the P-channel MIS transistor; and (d) forming, above the first layer metal interconnect, an upper layer metal interconnect including a sixth metal interconnect for grounding the gate electrode of the N-channel MIS transistor, a seventh metal interconnect for connecting the drain of the N-channel MIS transistor, the gate electrode of the P-channel MIS transistor and the second N-type well to a first control circuit, and an eighth metal interconnect for connecting the drain of the P-channel MIS transistor and the input port of the backward diode to a second control circuit.

According to this method, positive charge and negative charge generated during the fabrication of the semiconductor device fabricated in parallel to the semiconductor protection circuit can be drained to the ground. In addition, when the semiconductor device is driven after completing the fabrication, it can be controlled so that any current can flow from the interconnect to neither the forward diode nor the backward diode, and hence, any voltage in a wide voltage range from a positive voltage to a negative voltage can be applied to the interconnect.

In the method for operating a semiconductor protection circuit of this invention, the semiconductor protection circuit includes a first metal interconnect that is connected to an interconnect included in a semiconductor device provided on a semiconductor substrate and is disposed on an upper layer than the interconnect; a forward diode having an input port connected to the interconnect; a backward diode that has an output port connected to the interconnect and is connected to the forward diode in parallel; an N-channel MIS transistor whose drain is connected to an output port of the forward diode, whose source is connected to the semiconductor substrate and whose gate electrode is grounded through a second metal interconnect disposed on an upper layer than the first metal interconnect; a P-channel MIS transistor whose drain is connected to an input port of the backward diode and whose source is connected to the semiconductor substrate; a first antenna connected to the gate electrode of the N-channel MIS transistor and disposed on the same interconnect layer as at least a part of the first metal interconnect; a second antenna connected to a gate electrode of the P-channel MIS transistor and disposed on the same interconnect layer as at least a part of the first metal interconnect; a first control circuit for controlling potential of the drain of the N-channel MIS transistor, the gate electrode of the P-channel MIS transistor and the second N-type well; and a second control circuit connected to the drain of the P-channel MIS transistor and the input port of the backward diode, and in the case where positive charge enters the first metal interconnect before grounding the gate electrode of the N-channel MIS transistor and before connecting the gate electrode of the P-channel MIS transistor to the first control circuit, the positive charge is transferred to ground through the forward diode and the N-channel MIS transistor.

As described above, in the semiconductor protection circuit of the present invention, positive charge generated during the fabrication of the semiconductor device is drained to the ground through the forward diode and the NMOS. Also, negative charge generated during the fabrication is drained to the ground through the backward diode and the PMOS. Furthermore, when the semiconductor device is driven after completing the fabrication, a voltage in a wide range from a positive voltage to a negative voltage can be applied to a word line by controlling voltages in wells where the forward diode and the backward diode are disposed. Specifically, the semiconductor protection circuit of this invention is applicable also to a semiconductor memory where a negative voltage is used in the operation.

DETAILED DESCRIPTION OF THE INVENTION

Embodiment 1

Figure 1:
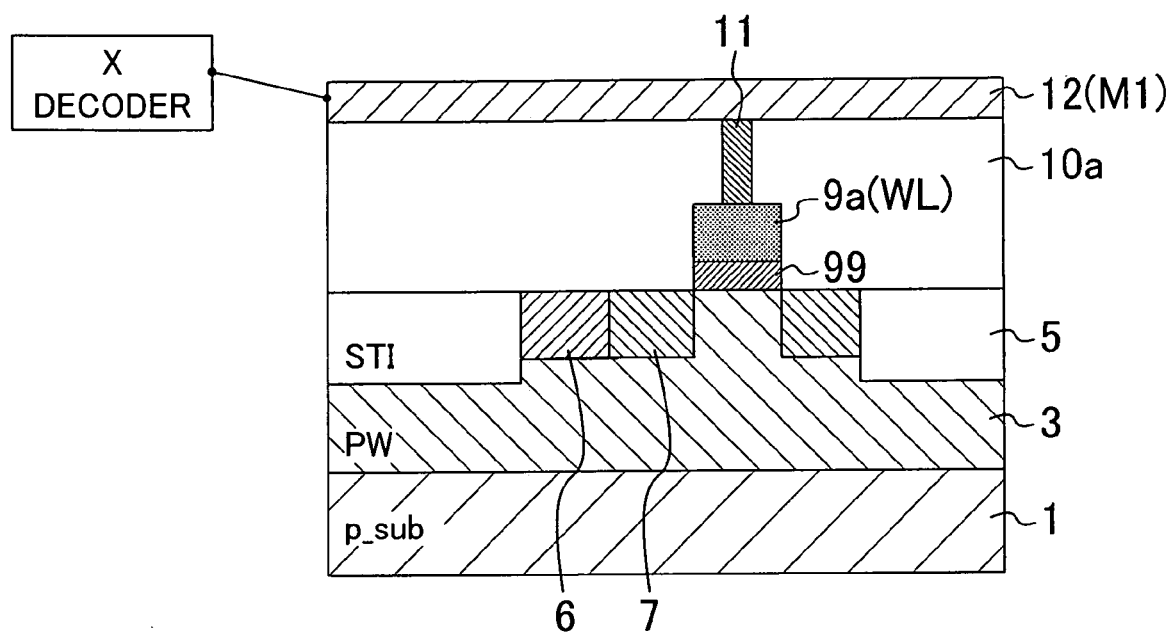
FIG. 1 is a cross-sectional view of a memory cell of a MONOS semiconductor memory according to Embodiment 1 of the invention.
Figure 2:
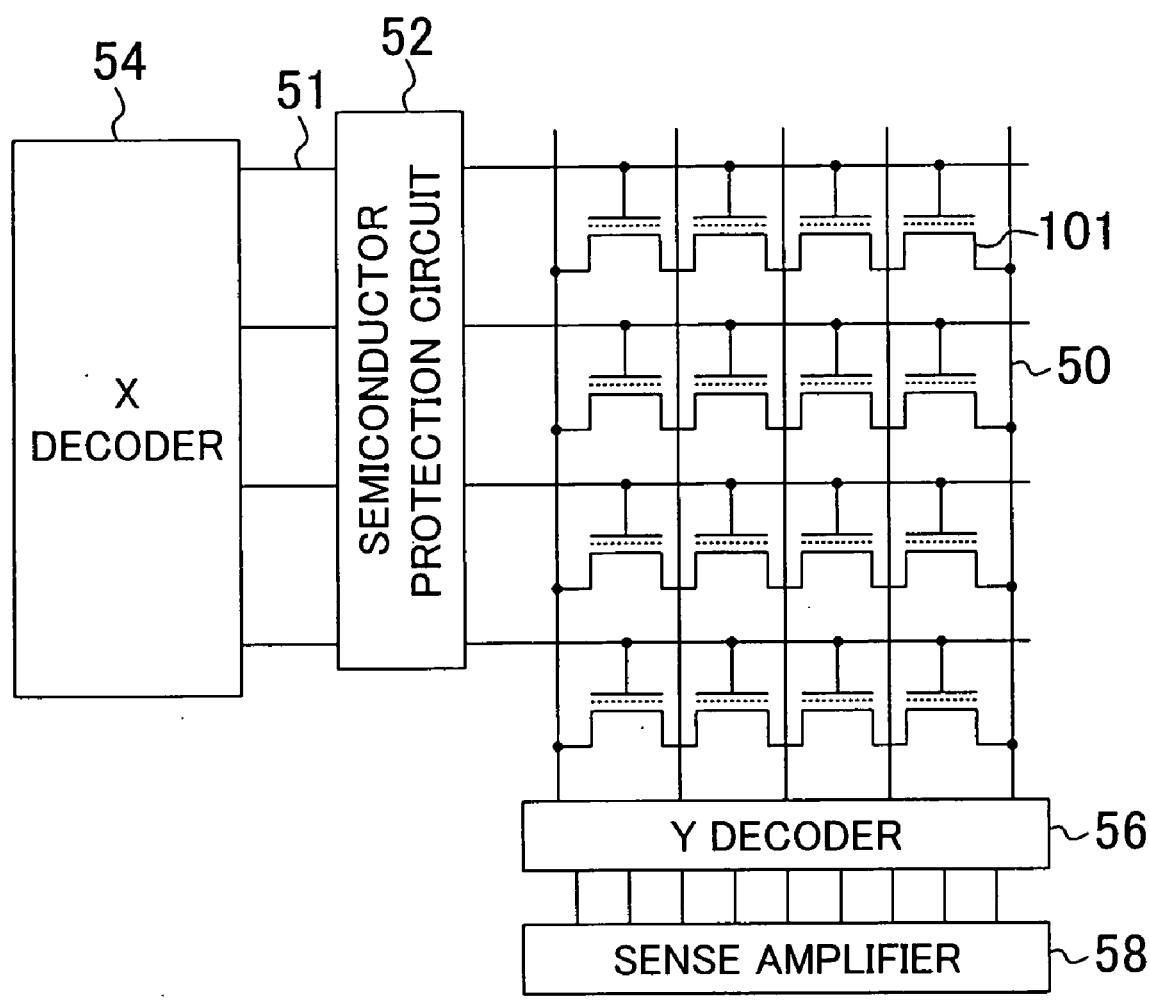
FIG. 2 is a circuit diagram of a memory cell array of the semiconductor memory of Embodiment 1.
Figure 3:
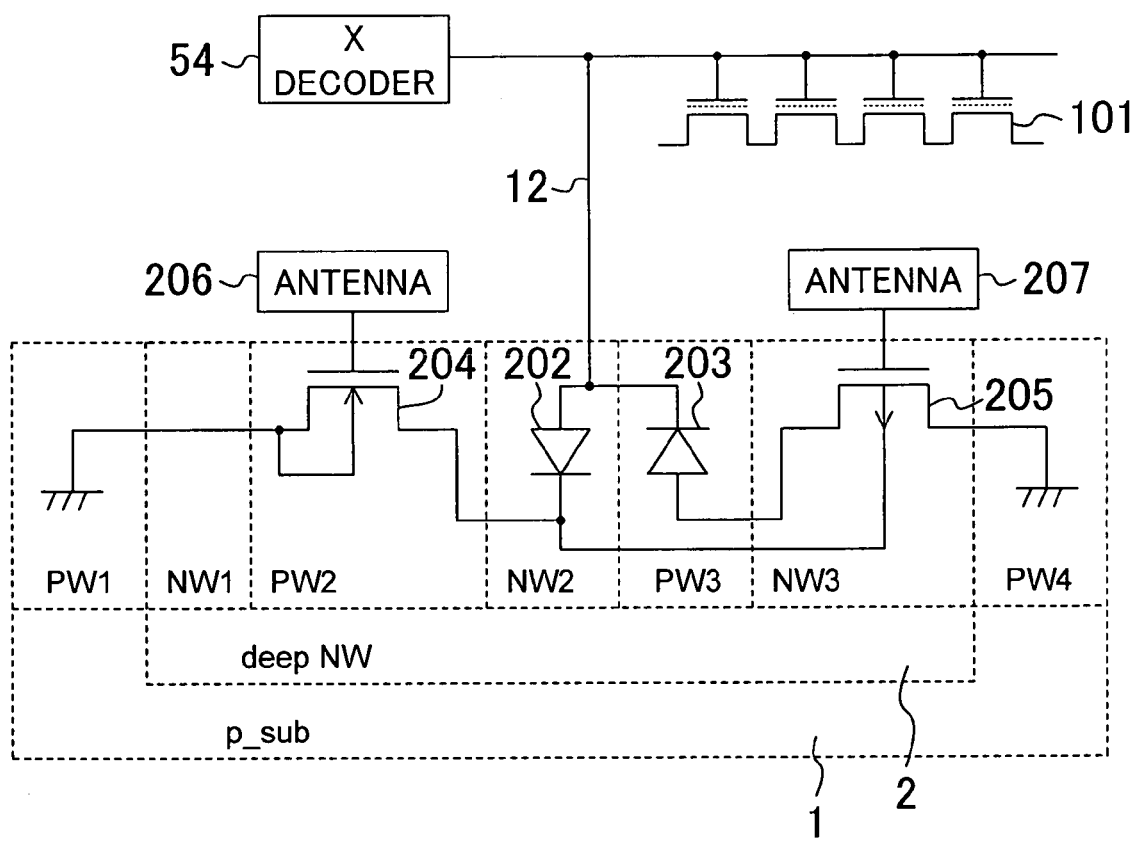
FIG. 3 is a circuit diagram for schematically showing a state of a semiconductor protection circuit of Embodiment 1 attained during fabrication.

FIG. 1 is a cross-sectional view of a memory cell of a MONOS semiconductor memory according to Embodiment 1 of the invention, and FIG. 2 is a circuit diagram of a memory cell array of the semiconductor memory of this embodiment. Also, FIG. 3 is a circuit diagram for schematically showing a semiconductor protection circuit of the semiconductor memory of this embodiment in a state attained during the fabrication.

As shown in FIG. 2 the semiconductor memory of this embodiment includes a plurality of memory cells 101 arranged in the form of a matrix; word lines 51 provided correspondingly to respective rows of the memory cells 101 to be connected to gate electrodes of MONOS structures of the memory cells 101; bit lines 50 provided correspondingly to respective columns to be connected to N-type diffusion layers 7 of the memory cells 101; an X decoder 54 for driving the word lines 51; a Y decoder 56 connected to the respective bit lines 50; a sense amplifier 58 for amplifying a signal read by the Y decoder 56; and a semiconductor protection circuit 52 provided between the X decoder 54 and the word lines 51.

Furthermore, as shown in FIG. 1, each memory cell 101 includes a p-type well 3 formed on, for example, a P-type semiconductor substrate 1; an isolation insulating film (STI) 5 surrounding a semiconductor forming region of the P-type well 3; a charge trapping layer 99 and a word line electrode 9a successively formed on the P-type well 3 in this order in the upward direction; N-type diffusion layers 7 formed in the P-type well 3 on both sides of the charge trapping layer 99; a word line 51 (see FIG. 2) formed above the word line electrode 9a and made of a first layer metal interconnect (M1) 12; and a contact 11 for connecting the word line electrode 9a and the first layer metal interconnect 12. Each bit line is connected to N-type diffusion layers (corresponding to sources or drains) of the memory cells 101 disposed in two columns.

The aforementioned structures of the memory cell array and the memory cell 101 are the same as those of a general MONOS memory, from which the semiconductor memory of this embodiment is different in the structure of the semiconductor protection circuit.

As shown in FIG. 3, in the state of the semiconductor memory of this embodiment attained when the first layer metal interconnect 12 is formed, the semiconductor protection circuit includes a deep N-type well 2 formed in the P-type substrate 1; P-type wells PW1, PW2 and PW3 and N-type wells NW1, NW2 and NW3 formed in the P-type substrate 1 or in the deep N-type well 2; an N-channel MIS transistor (hereinafter referred to as the NMIS) 204 provided on the P-type well PW2 (corresponding to a second P-type well) and having the source grounded (namely, connected to the P-type substrate 1); a forward diode 202 provided within the N-type well NW2 (corresponding to a first N-type well) having an input port connected to the word line 51 through the first layer metal interconnect 12 and an output port connected to the drain of the NMIS 204; a P-channel MIS transistor (hereinafter referred to as the PMIS) 205 provided on the N-type well NW3 (corresponding to a second N-type well) and having the source grounded (namely, connected to the P-type substrate 1); and a backward diode 203 provided within the P-type well PW3 (corresponding to a first P-type well) and having an output port connected to the word line 51 through the first layer metal interconnect 12 and an input port connected to the drain of the PMIS 205. The gate electrode of the NMIS 204 is connected to an NMIS gate antenna (corresponding to a first antenna) 206 made of a part of the first layer metal interconnect, and the gate electrode of the PMIS 205 is connected to a PMIS gate antenna (corresponding to a second antenna) 207 made of a part of the first layer metal interconnect. The NMIS gate antenna 206 and the PMIS gate antenna 207 are made of the same material as the metal interconnect and have substantially the same shape as a general metal interconnect.

Figure 4:
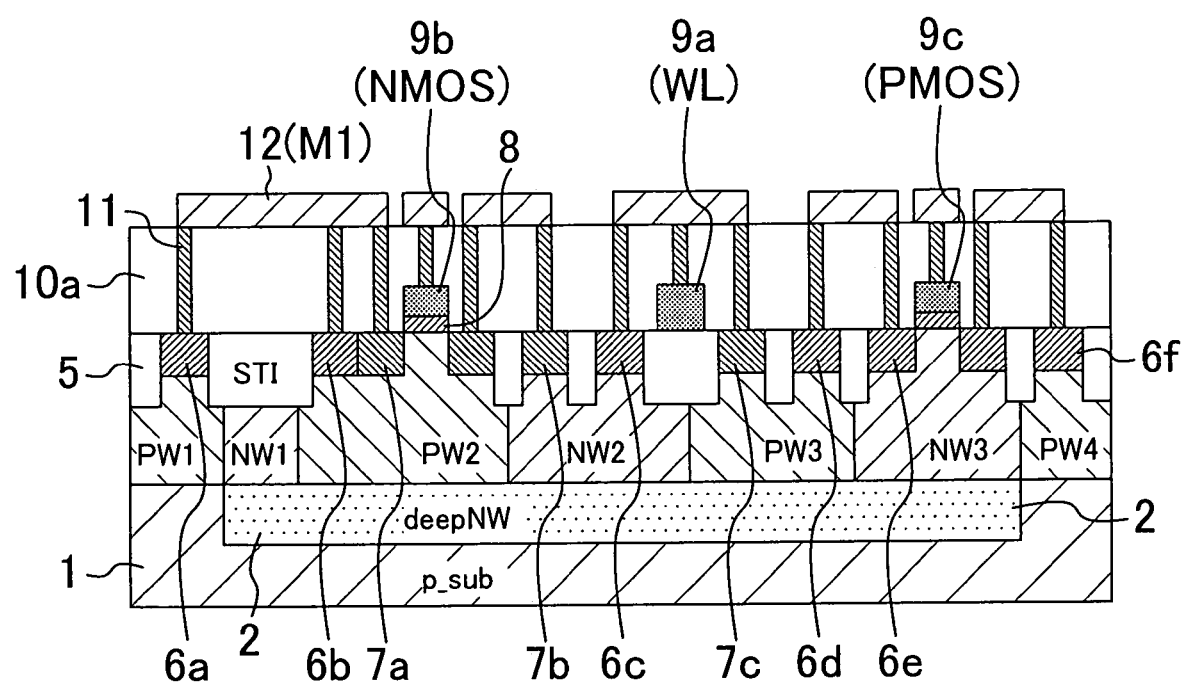
FIG. 4 is a schematic cross-sectional view of the semiconductor protection circuit of Embodiment 1 shown in FIG. 3.

FIG. 4 is a schematic cross-sectional view of the semiconductor protection circuit according to Embodiment 1 of the invention shown in FIG. 3. FIG. 4 shows a state attained during the fabrication and shows the semiconductor protection circuit in the state attained, for example, immediately after forming the first layer metal interconnect 12.

As shown in FIG. 4, the deep N-type well 2 is formed in the P-type semiconductor substrate 1, and the P-type wells PW2 and PW3 and the N-type wells NW1, NW2 and NW3 are disposed in the deep N-type well 2. A P-type diffusion layer 6c constructing the forward diode 202 together with the N-type well NW2 is disposed in a surface portion of the N-type well NW2, and an N-type diffusion layer 7a of the NMIS 204 is disposed in a surface portion of the P-type well PW2. Also, an N-type diffusion layer 7c constructing the backward diode 203 together with the P-type well PW3 is disposed in a surface portion of the P-type well PW3, and a P-type diffusion layer of the PMIS 205 is disposed in a surface portion of the N-type well NW3.

The word line electrode 9a of the memory cell 101 is connected to the first layer metal interconnect 12 through a contact 11 and is further connected to the P-type diffusion layer 6c included in the forward diode 202 through a contact 11. The N-type diffusion layer 7a disposed in the N-type well NW2 and one of the N-type diffusion layers 7a working as the drain of the NMIS 204 an connected to each other through a contact 11 and the first layer metal interconnect 12. The potential of the other N-type diffusion layer 7b working the source of the NMIS 204 is fixed to the ground potential through the P-type diffusion layer 6a disposed in the P-type well PW1. It is noted that the P-type diffusion layer B disposed in the P-type well PW2 is also connected to the P-type diffusion layer 6a disposed in the P-type well PW1 through a contact 11 and the potential of the P-type well PW2 is fixed to the ground potential.

Furthermore, the word line electrode 9a of the memory cell 101 is connected to the first layer metal interconnect 12 through the contact 11 and is further connected to the N-type diffusion layer 7c included in the backward diode 203 through a contact 11, and the P-type diffusion layer 6b disposed in the P-type well PW3 where the backward diode 203 is disposed and a P-type diffusion layer 6a working the drain of the PMIS 205 at connected to each other through a contact 11 and the first layer metal interconnect 12. The potential of one P-type diffusion layer 6e working as the source of the PMIS 205 is fixed to the ground potential through a P-type diffusion layer 6f disposed in the P-type well PW4.

In general, charge in the positive direction or the negative direction is generated through various processes such as plasma etching process employed for forming an interconnect, film formation process for growing a silicon oxide film or the like by plasma CVD and cleaning process such as scrubber cleaning.

Now, a protection method from charge performed by the semiconductor protection circuit of this embodiment will be described.

Figure 5:
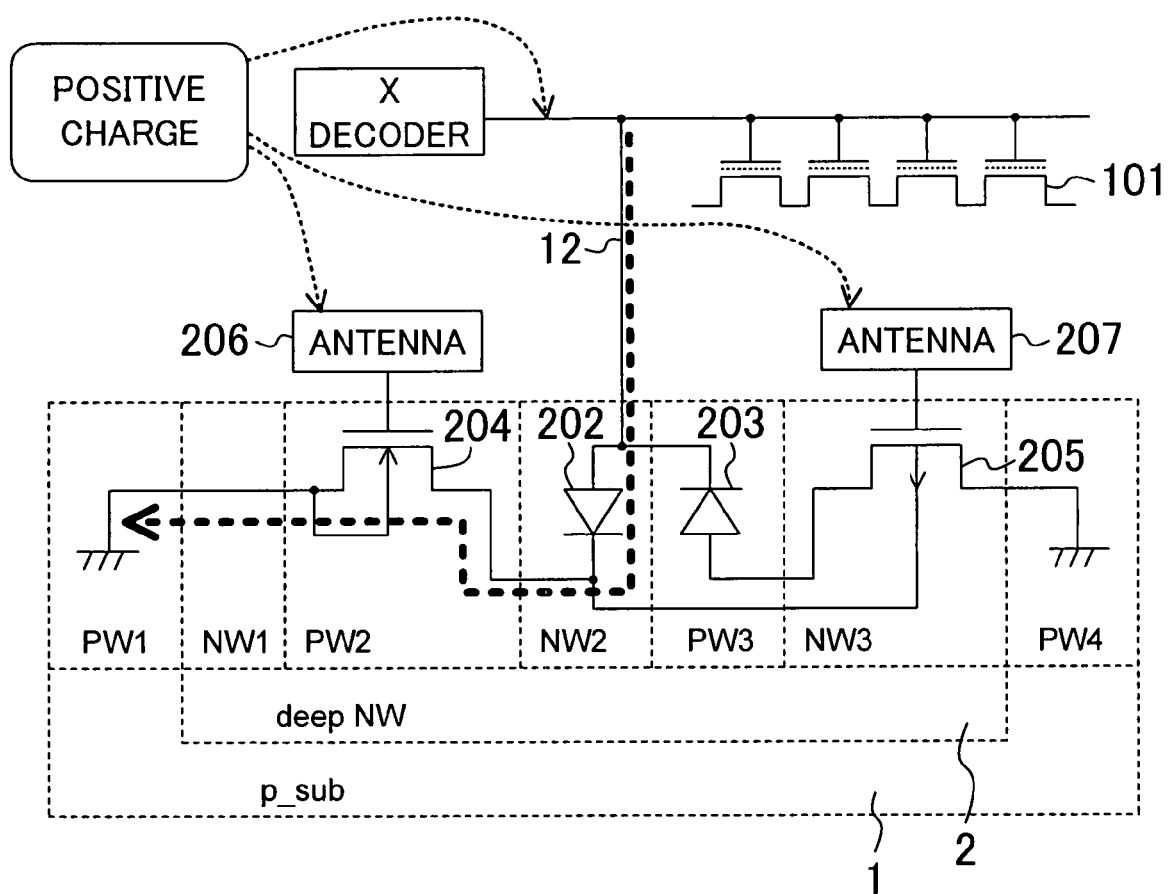
FIG. 5 is a diagram for showing flow of positive charge in the semiconductor protection circuit of Embodiment 1.

FIG. 5 is a diagram for showing the flow of positive charge in the semiconductor protection circuit of this embodiment. When positive charge enters the first layer metal interconnect 12, the drain voltage of the NMIS 204 is increased in the positive direction through the forward diode 202. Simultaneously, since the potential of the NMIS gate antenna 206 connected to a gate electrode 9b (see FIG. 4) of the NMIS 204 is also increased in the positive direction, the NMIS 204 is turned on, and hence, the drain and the source of the NMIS 204 are connected to each other. Accordingly, the positive charge transferred to the drain of the NMIS 204 can be drained to the ground. Specifically, when the threshold voltage of the NMIS 204 is approximately 1 V, the potential increase of the word line electrode 9a caused by the positive charge can be suppressed to approximately 1 V.

Figure 6:
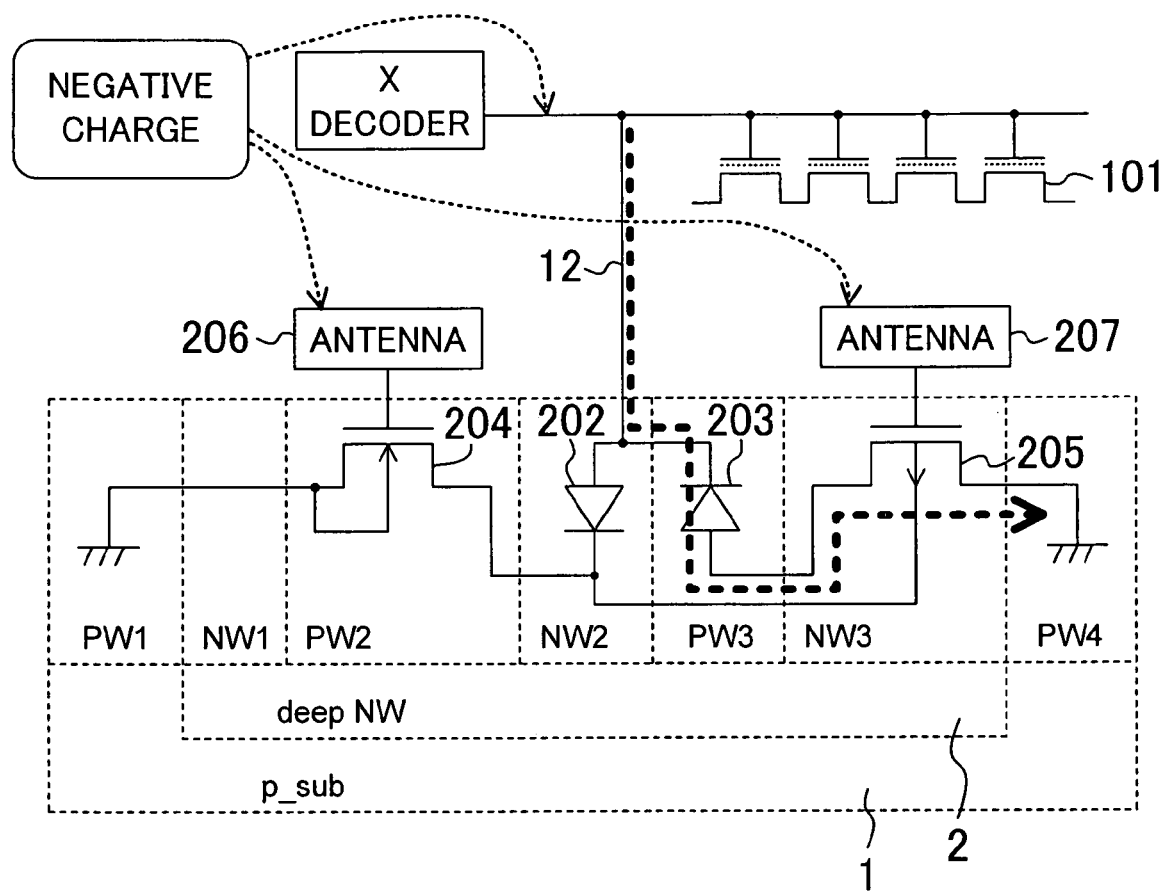
FIG. 6 is a diagram for showing flow of negative charge in the semiconductor protection circuit of Embodiment 1.

FIG. 6 is a diagram for showing the flow of negative charge in the semiconductor protection circuit of this embodiment. When negative charge enters the first layer metal interconnect 12, the drain voltage of the PMIS 205 is dropped in the negative direction through the backward diode 203. Simultaneously, since the potential of the PMIS gate antenna 207 connected to a gate electrode 9c of the PMIS 205 is also dropped in the negative direction, the PMIS 205 is turned on, and hence, the drain and the source of the PMIS 205 are connected to each other. Accordingly, the negative charge transferred to the drain of the PMIS 205 can be drained to the ground. Specifically, when the threshold voltage of the PMIS 205 is approximately −1 V, the potential drop of the word line electrode 9a caused by the negative charge can be suppressed to approximately −1 V.

Next, a state of the semiconductor protection circuit of this embodiment attained after completing the fabrication will be described.

Figure 7:
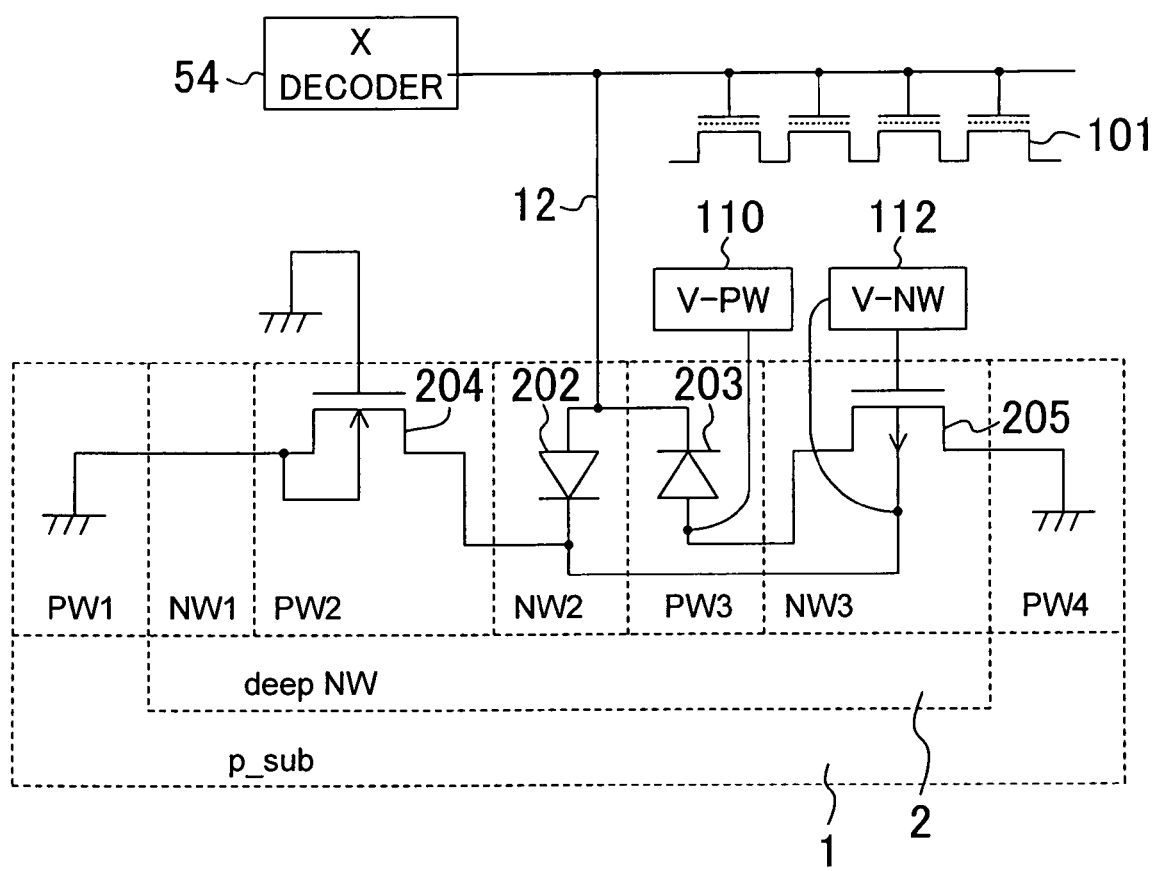
FIG. 7 is a circuit diagram for schematically showing a state of the semiconductor protection circuit of Embodiment 1 attained after completing the fabrication.

FIG. 7 is a circuit diagram for schematically showing the state of the semiconductor protection circuit of this embodiment attained after completing the fabrication. As shown in FIG. 7, the gate electrode and the source of the NMIS 204 are connected to the ground potential, and the gate electrode 9c of the PMIS 205 is electrically connected to the N-type well NW3.

Figure 8:
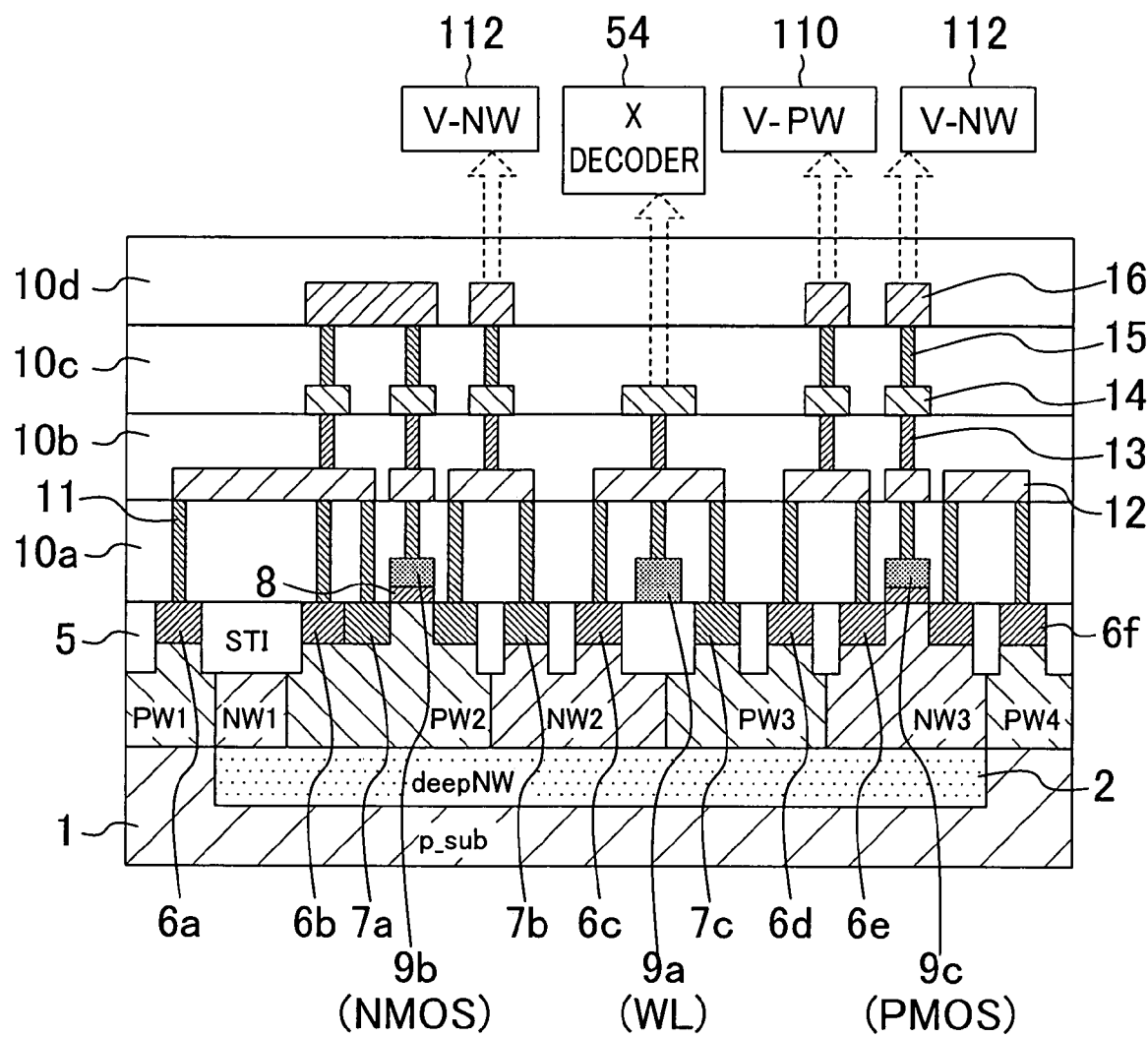
FIG. 8 is a cross-sectional view of the semiconductor protection circuit of Embodiment 1 obtained after completing the fabrication.

FIG. 8 is a cross-sectional view of the semiconductor protection circuit of this embodiment obtained after completing the fabrication as shown in FIG. 7.

As shown in FIG. 8, the word line electrode 9a is connected to the first layer metal interconnect 12 through the contact 11 and is further connected to a second layer metal interconnect 14 through a first via 13 and is connected to the X decoder 54 through the second layer metal interconnect 14.

The gate electrode 9b of the NMIS 204 is connected to the second layer metal interconnect 14 successively through the contact 11, the first layer metal interconnect 12 and the first via 13, and is grounded through a second via 15 and a third layer metal interconnect 16. In this manner, as a characteristic of this embodiment, the gate electrode 9b of the NMIS 204 of the semiconductor protection circuit is placed in a floating state connected to the antenna while processing the metal interconnect connected to the word line of the memory cell 101, and is grounded after completing the processing of the metal interconnect connected to the word line of the memory cell 101. It is noted that the gate electrode 9b of the NMIS 204 may be grounded through a metal interconnect disposed on an upper layer than the third layer.

Also, the gate electrode 9c of the PMIS 205 is connected to the second layer metal interconnect 14 successively through the contact 11, the first layer metal interconnect 12 and the first via 13, and is further connected to a V-NW control circuit (corresponding to a first control circuit) 112 through the second via 15 and the third layer metal interconnect 16. In this manner, as a characteristic of this embodiment, the gate electrode 9c of the PMIS 205 of the semiconductor protection circuit is placed in a floating state connected to the antenna while processing the metal interconnect connected to the word line of the memory cell and is connected to the V-NW control circuit 112 after completing the processing of the metal interconnect connected to the word line of the memory cell 101. It is noted that the gate electrode 9c of the PMIS 205 may be provided with a voltage the same as that applied to the N-type well NW3 by the V-NW control circuit 112 or may be connected to the N-type well NW3 through a metal interconnect disposed on an upper layer than the third layer.

Furthermore, the potential of the P-type well PW3 is controlled by a V-PW control circuit (corresponding to a second control circuit) 110, and the potential of the N-type wells NW1, NW2 and NW3 and the deep N-type well 2 is controlled by the V-NW control circuit 112.

Figure 9:
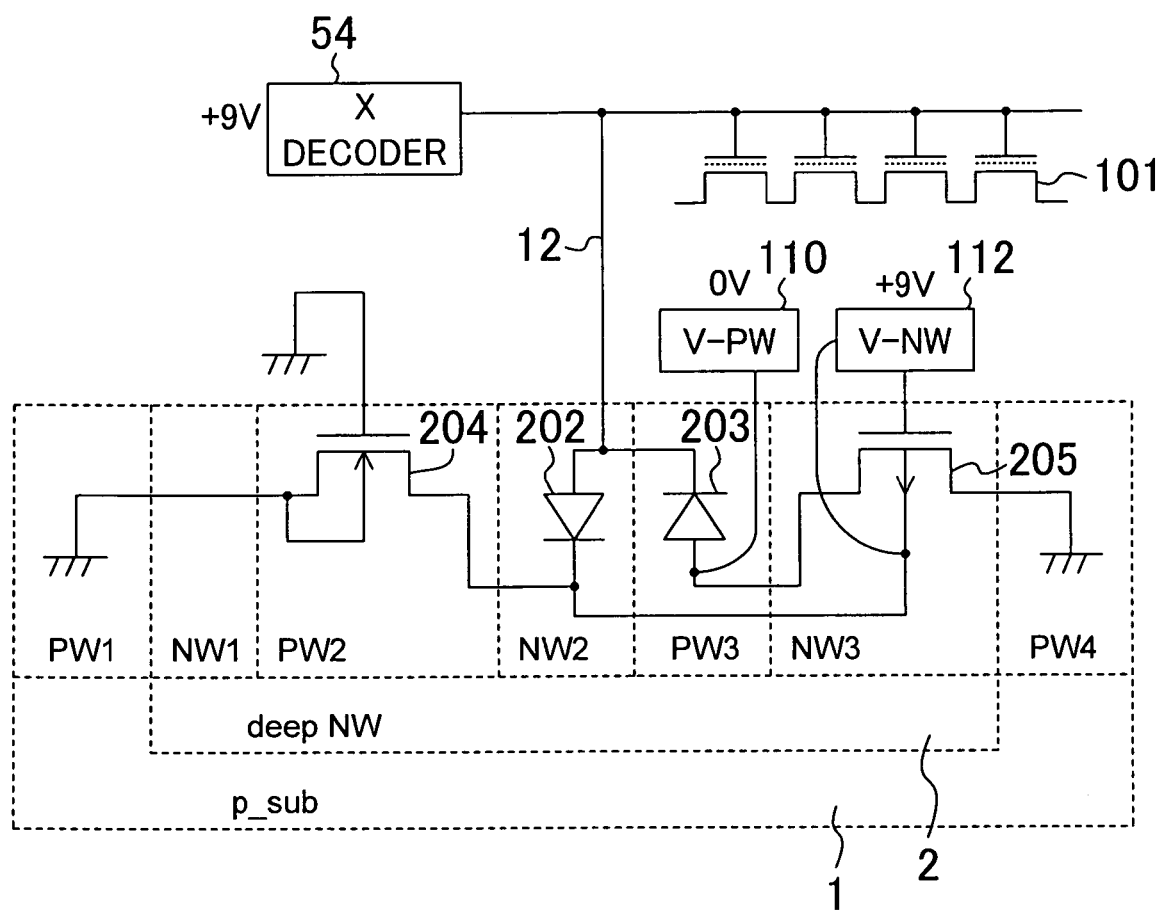
FIG. 9 is a circuit diagram for schematically showing an operation of the semiconductor protection circuit of Embodiment 1 performed in a data write operation of the semiconductor memory.

FIG. 9 is a circuit diagram for schematically showing an operation of the semiconductor protection circuit of this embodiment performed in a data write operation of the semiconductor memory. As shown in FIG. 9, in a data write operation, a voltage of approximately +9 V is applied to the word line of a selected memory cell 101 and a voltage of approximately +0 V is applied to the word lines of unselected memory cells 101. At this point, the potential of the N-type wells NW1, NW2 and NW3 and the deep N-type well 2 should be set to a high voltage of +9 V or more so that no current can pass the forward diode 202. Also, the potential of the P-type well PW3 should be set to a low voltage of 0 V or less so that no current can pass the backward diode 203.

Specifically, the potential of the N-type wells NW1, NW2 and NW3 and the deep N-type well 2 is controlled to be +9 V by the V-NW control circuit 112, and the potential of the P-type well PW3 is controlled to be 0 V by the V-PW control circuit 110. Accordingly, neither the forward diode 202 nor the backward diode 203 is conductive, and hence, a voltage of approximately +9 V is applied to the word line of the selected memory cell 101. In the case where the semiconductor protection circuit of this embodiment is used in a MONOS memory, in order to write data, the potential of the P-type well PW3 should be 0 V or less and the potential of the N-type wells NW1, NW2 and NW3 and the deep N-type well 2 should be not less than a writing voltage (9 V).

Figure 10:
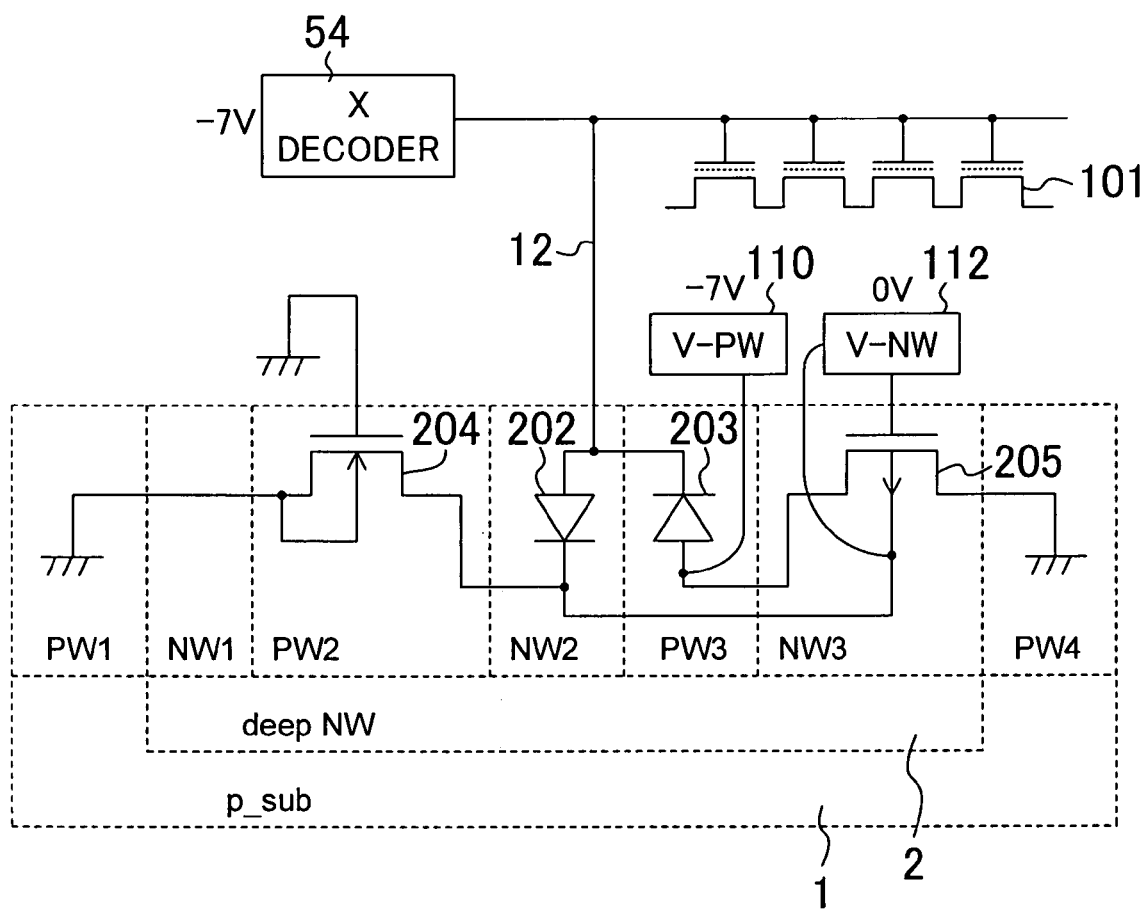
FIG. 10 is a circuit diagram for schematically showing an operation of the semiconductor protection circuit of Embodiment 1 performed in a data delete operation of the semiconductor memory.

FIG. 10 is a circuit diagram for schematically showing an operation of the semiconductor protection circuit of this embodiment performed in a data delete operation of the semiconductor memory. In a data delete operation, a voltage of approximately −7 V is applied to the word line of a selected memory cell 101, and a voltage of approximately +0 V is applied to the word lines of unselected memory cells 101. At this point, the potential of the N-type wells NW1, NW2 and NW3 and the deep N-type well 2 should be set to a high voltage of +0 V or more so that no current can pass the forward diode 202. Also, the potential of the P-type well PW3 should be set to a low voltage of −7 V or less so that no current can pass the backward diode 203.

Specifically, the potential of the N-type wells NW1, NW2 and NW3 and the deep N-type well 2 is controlled to be 0 V by the V-NW control circuit 112, and the potential of the P-type well PW3 is controlled to be −7 V by the V-PW control circuit 110. Accordingly, neither the forward diode 202 nor the backward diode 203 is conductive, and hence, a voltage of approximately −7 V is applied to the word line of the selected memory cell 101. In the case where the semiconductor protection circuit of this embodiment is used in a MONOS memory, in order to delete data, the potential of the P-type well PW3 should be not more than a deleting voltage (−7 V) and the potential of the N-type wells NW1, NW2 and NW3 and the deep N-type well 2 should be 0 V or more.

Figure 11:
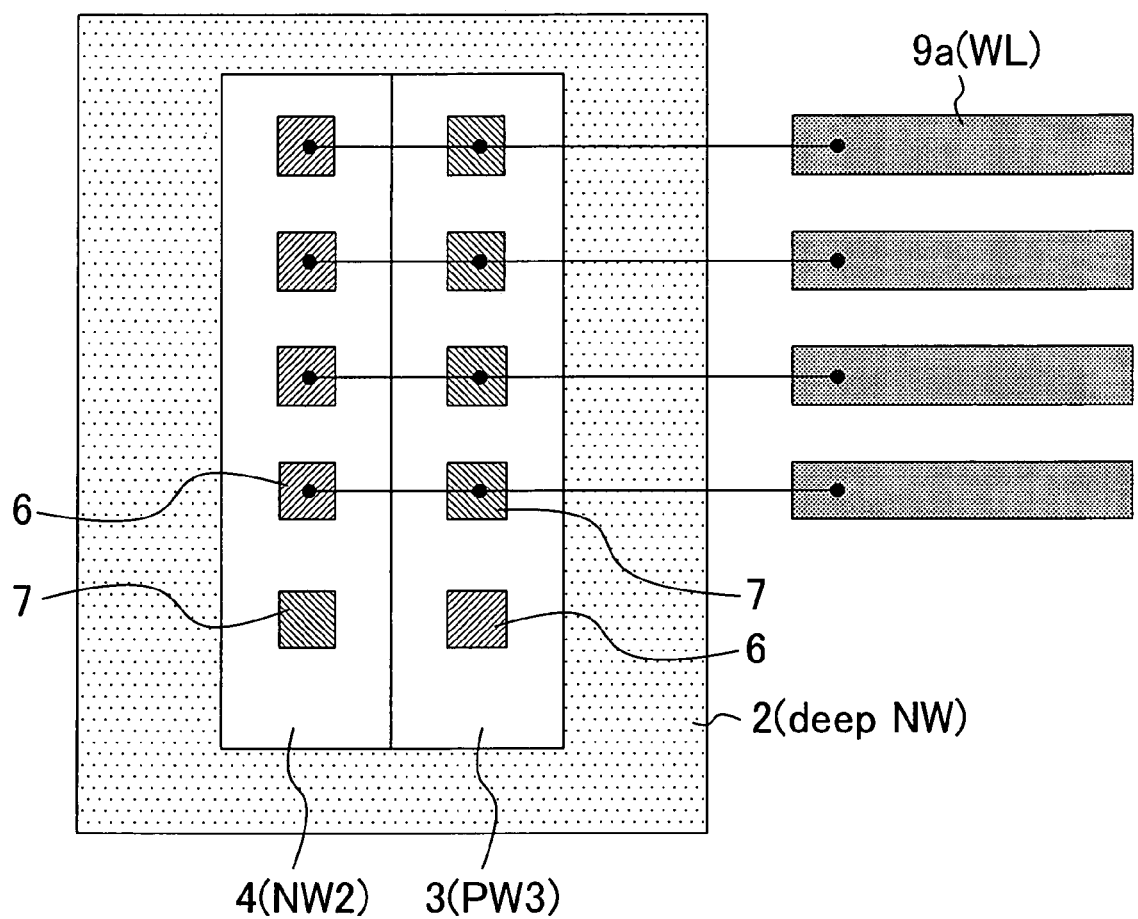
FIG. 11 is a schematic plan view of exemplified layout of the semiconductor protection circuit of Embodiment 1.

FIG. 11 is a plan view for schematically showing exemplified layout of the semiconductor protection circuit of this embodiment.

As shown in FIG. 11, a deep N-type well 2 is provided adjacent to one end of each of a plurality of word line electrodes 9a disposed in parallel to one another. In this deep N-type well 2, a P-type well PW3 (a p-type well 3) and an N-type well NW2 (an N-type well 4) are provided. In the P-type well PW3, N-type diffusion layers 7 included in backward diodes 203 are arranged in number equal to the number of the word line electrodes 9a, and in the N-type well NW2, P-type diffusion layers 6 included in forward diodes 202 are arranged in number equal to the number of the word line electrodes 9a. One word line electrode 9a, one N-type diffusion layer 7 and one P-type diffusion layer 6 are mutually connected through a first layer metal interconnect 12. Since an NMIS 204 and a PMIS 205 can share the backward diode 203 and the forward diode 202, the semiconductor protection circuit of this embodiment can be very compact, and the circuit area of the semiconductor memory including the memory cell array is minimally increased by this semiconductor protection circuit.

In this manner, according to the semiconductor protection circuit of this embodiment, a high voltage can be effectively prevented from being applied to a memory cell array of a semiconductor memory by charge generated in, for example, interconnect formation process during the fabrication, and after completing the fabrication, word lines can be driven in a wide voltage range from a positive voltage to a negative voltage. Therefore, when the semiconductor protection circuit of this embodiment is employed, it is possible to realize a nonvolatile semiconductor memory, such as a MONOS memory, that can perform write and delete operations in a wide voltage range while suppressing variation of the threshold voltage of memory cells of the semiconductor memory.

It is noted that the semiconductor protection circuit of this embodiment can be fabricated by general semiconductor process through processing partially common to the semiconductor memory. Specifically, a deep N-type well 2 is formed by implanting an N-type impurity into a P-type semiconductor substrate 1 (see FIGS. 7 and 8). Next, after forming N-type wells NW1, NW2 and NW3 in the deep N-type well 2, P-type wells PW2 and PW3 are formed in the deep N-type well 2.

Then, an N-channel MIS transistor 204 is formed on the P-type well PW2, and a P-channel MIS transistor 205 is formed on the N-type well NW3. Simultaneously, a forward diode 202 is formed in the N-type well NW2 and a backward diode 203 is formed in the P-type well PW3. Thereafter, metal interconnects are formed by known wiring technique.

Although the semiconductor protection circuit is used in the MONOS memory in this embodiment, the semiconductor protection circuit of this embodiment is suitably used in any semiconductor memory where interconnects are driven by negative and positive voltages, such as a flash memory. Also, the layout and the driving voltages of the semiconductor protection circuit are not limited to those described in this embodiment.

Embodiment 2

Figure 12:
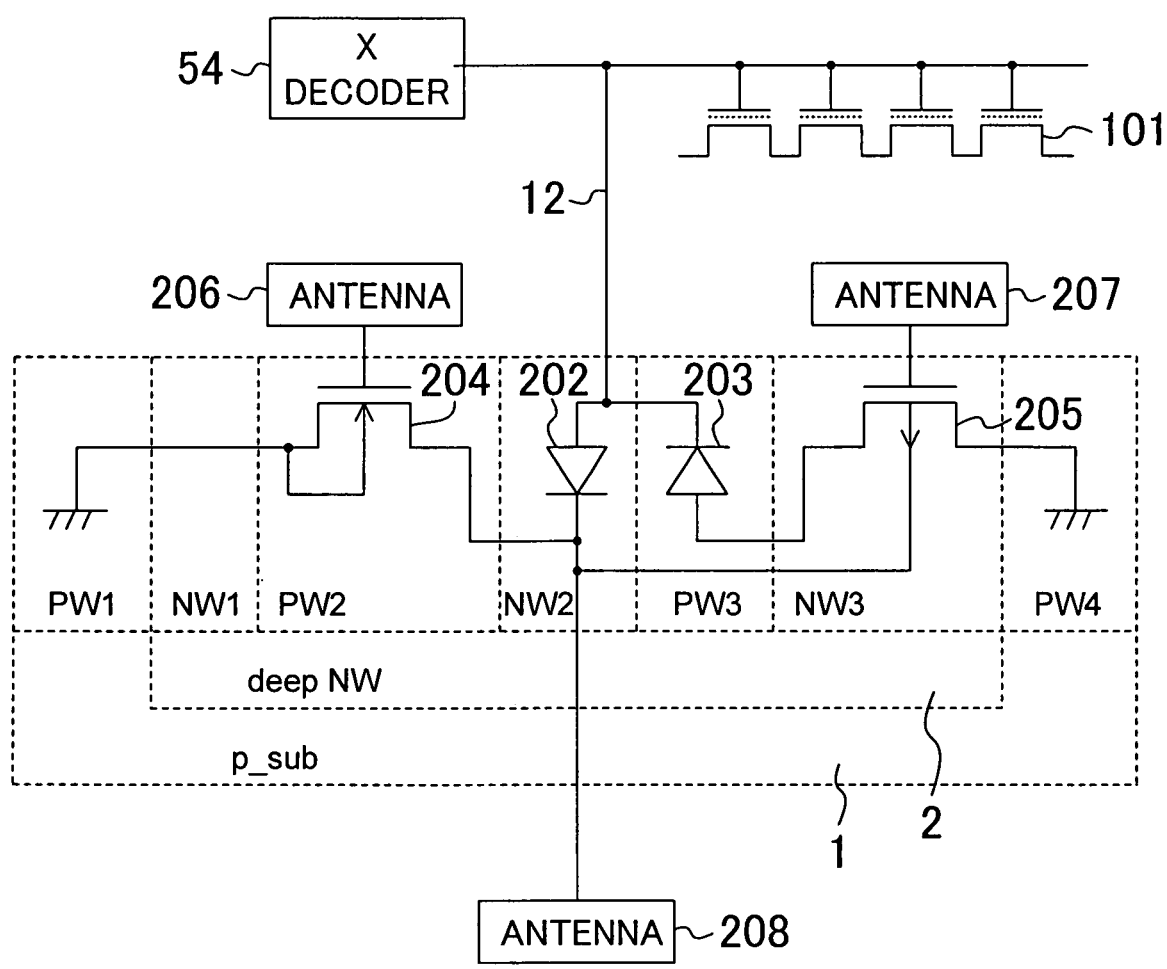
FIG. 12 is a circuit diagram of a semiconductor protection circuit according to Embodiment 2 of the invention.
Figure 13:
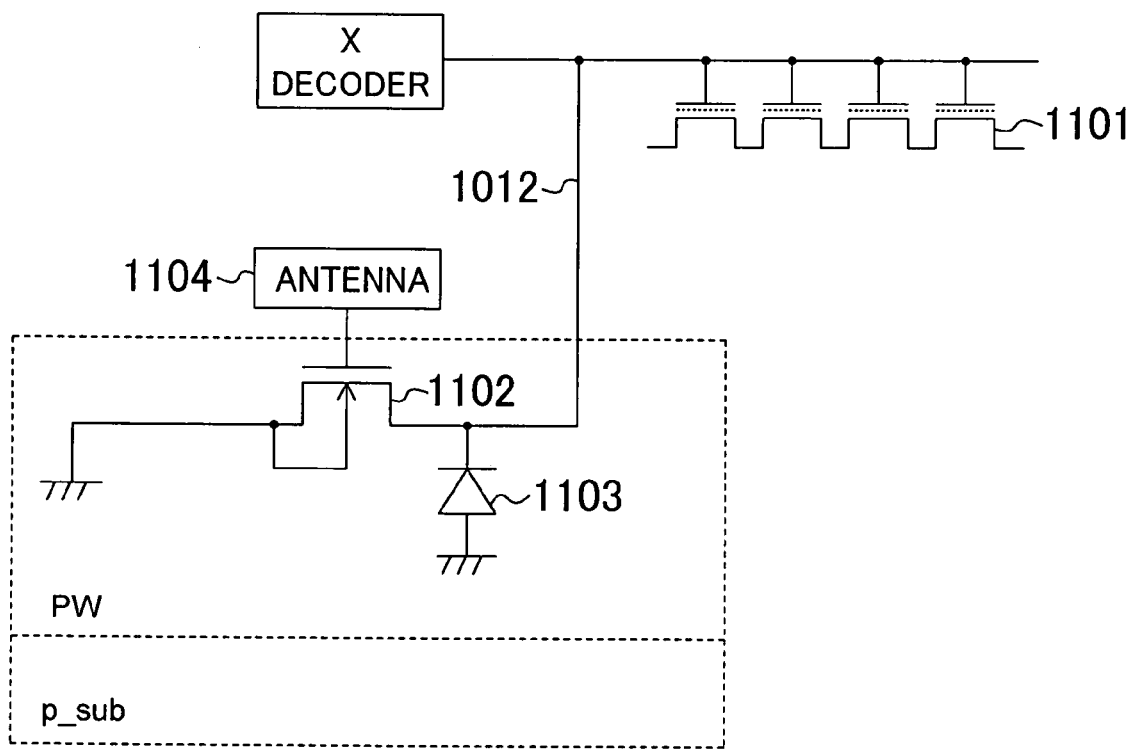
FIG. 13 is a circuit diagram of a conventional semiconductor protection circuit.
Figure 14:
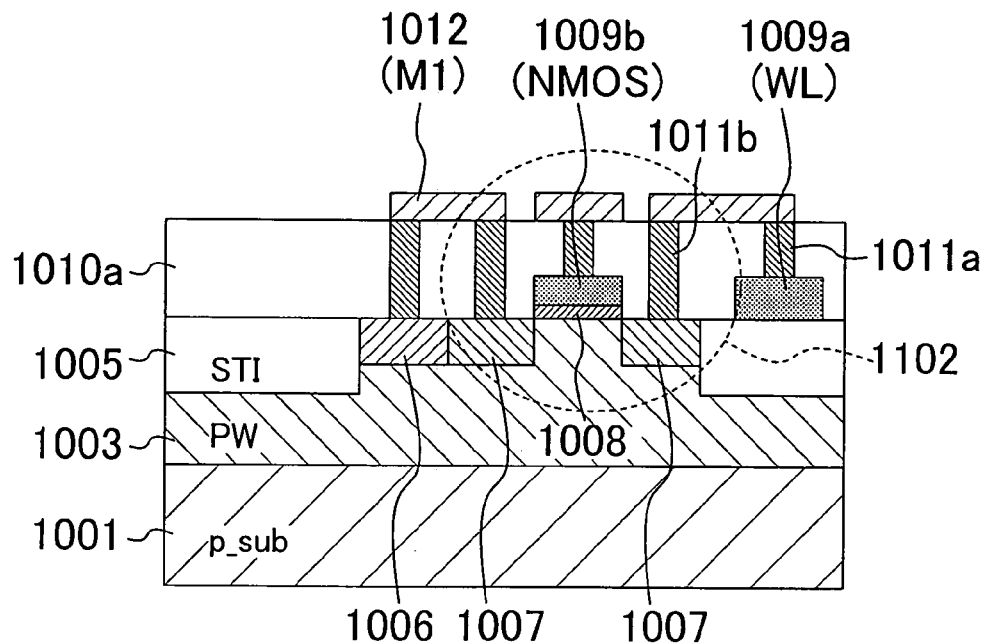
FIG. 14 is a cross-sectional view of the conventional semiconductor protection circuit of FIG. 13.
Figure 15:
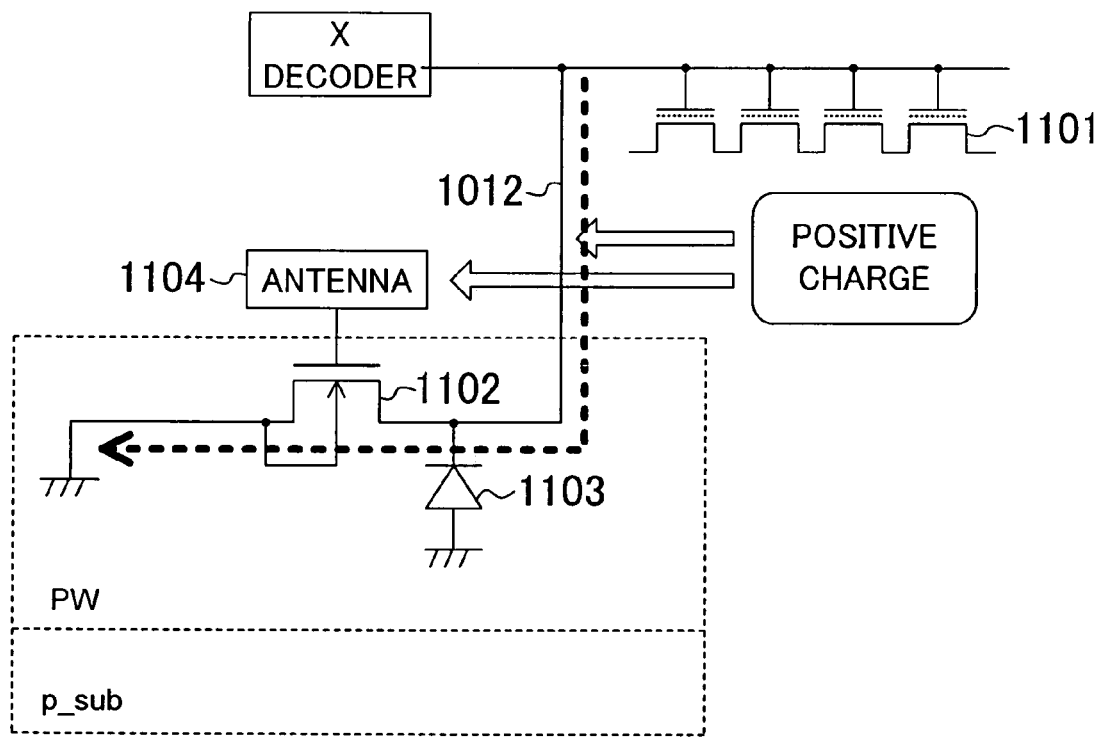
FIG. 15 is a diagram for showing a method for protecting a memory cell from positive charge by the conventional semiconductor protection circuit.
Figure 16:
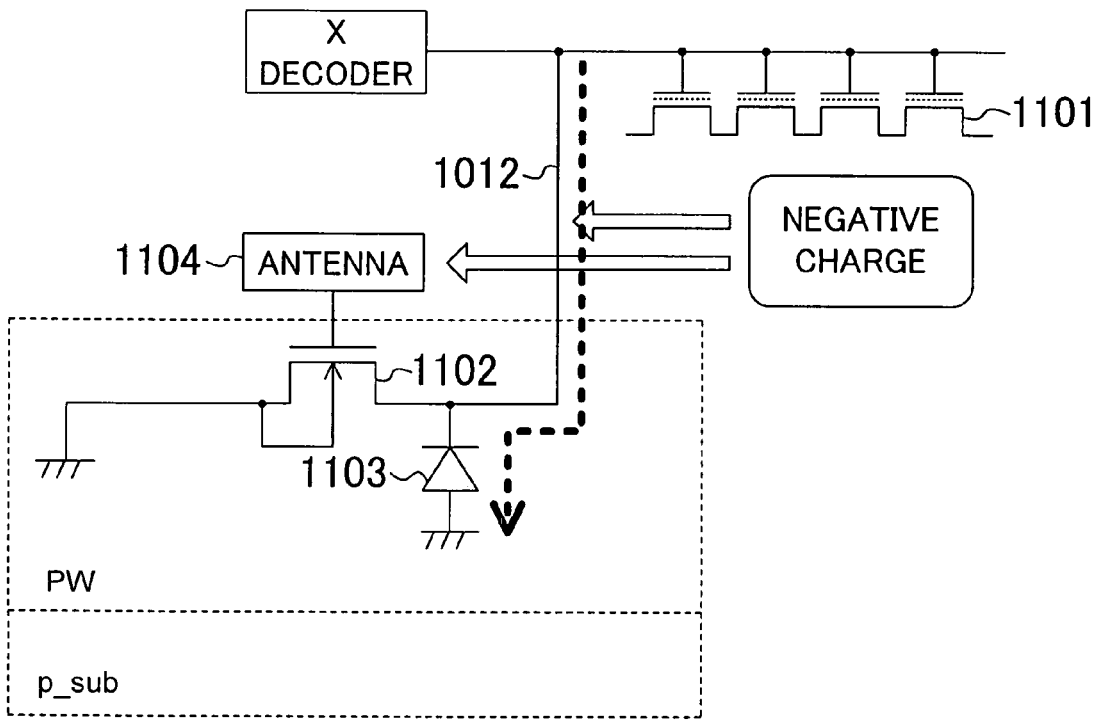
FIG. 16 is a diagram for showing a method for protecting a memory cell from negative charge by the conventional semiconductor protection circuit.
Figure 17:
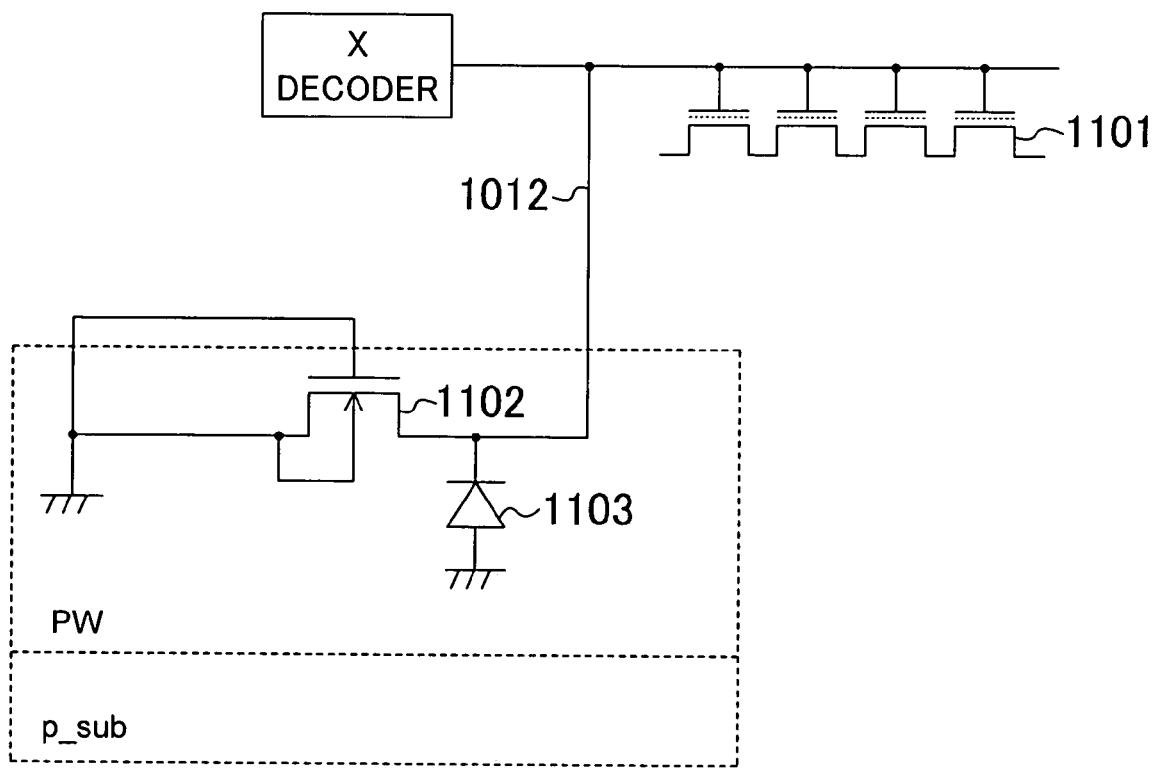
FIG. 17 is a circuit diagram of the conventional semiconductor protection circuit obtained after completing diffusion.
Figure 18:
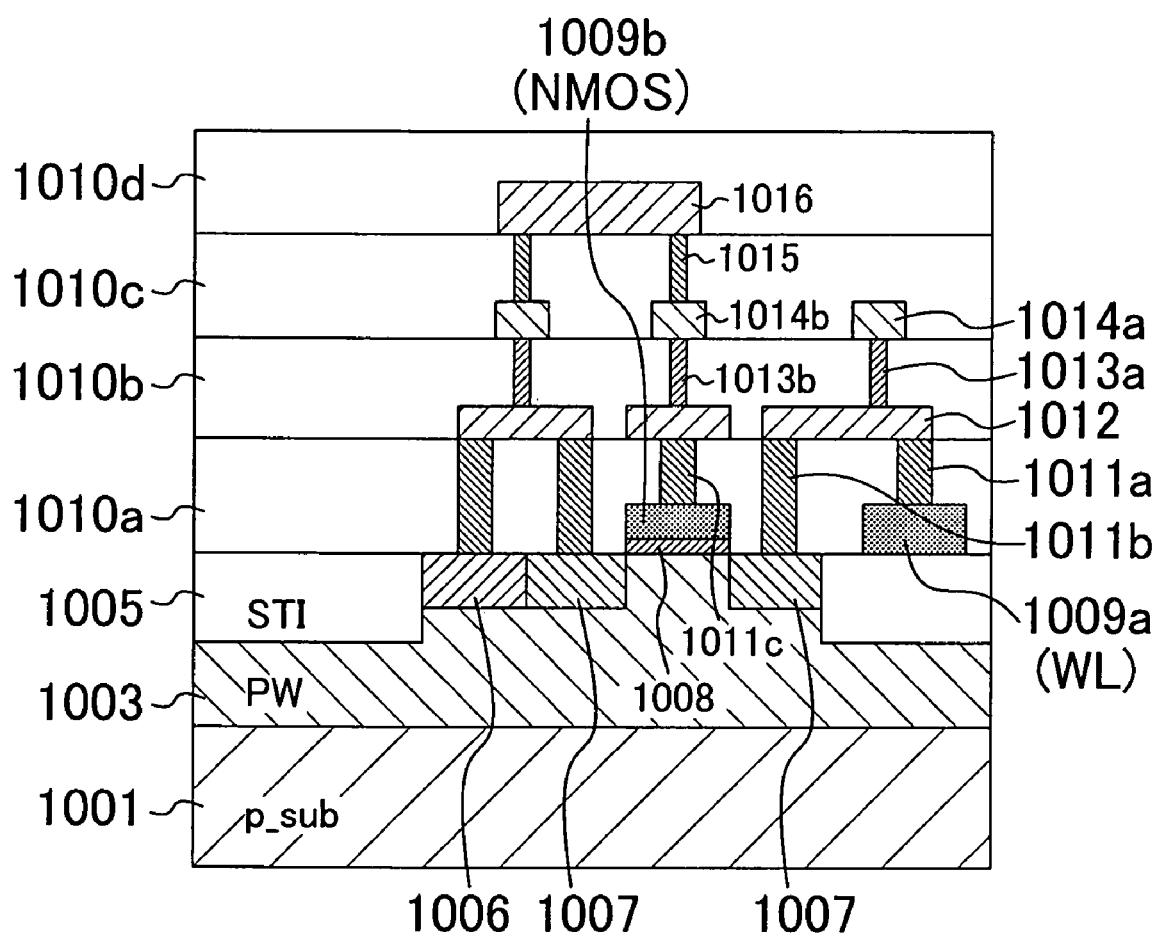
FIG. 18 is a cross-sectional view of the conventional semiconductor protection circuit of FIG. 13 obtained after completing fabrication (after completing the diffusion).

FIG. 12 is a circuit diagram of a semiconductor protection circuit according to Embodiment 2 of the invention. FIG. 12 shows a state of the semiconductor protection circuit attained, for example, during formation of a first layer metal interconnect.

The semiconductor protection circuit of this embodiment includes, in addition to the structure of the semiconductor protection circuit of Embodiment 1 shown in FIG. 4, a third antenna 208 connected to an N-type well. The third antenna 208 is made of an interconnect disposed on the same interconnect layer as an NMIS gate antenna 206 and a PMIS gate antenna 207 (for example, made of the first layer metal interconnect).

Owing to this structure, charge generated in forming interconnects enters a node between a forward diode 202 and the drain of an NMIS 204 from the third antenna 208. Accordingly, in the case where positive charge enters the third antenna 208 during the fabrication, the positive charge is drained to the ground through an NMIS 204. Thus, a larger quantity of positive charge can be drained to the ground than in the semiconductor protection circuit of Embodiment 1.

Furthermore, owing to this structure, in the case where negative charge enters a first layer metal interconnect 12 and similarly enters the antenna 207, the negative charge entering from the first layer metal interconnect 12 is drained from a PMIS 205. At this point, if the potential of an N-type well NW3 where the PMIS 205 is disposed is a positive voltage, the threshold voltage of the PMIS 205 is shifted in the negative direction, so as to degrade the charge removing performance. In order to prevent this degradation, the potential of the N-type well NW3 is fixed to the ground potential, namely, as in this embodiment, the antenna 208 is connected to the N-type well NW3 so that the potential of the N-type well NW3 can be fixed to the ground potential when negative charge enters the antenna 208.

Specifically, when negative charge enters the N-type well NW3, the potential of the N-type well NW3 and a deep N-type well NW is dropped in the negative direction. However, the deep N-type well NW and a P-type substrate together form a diode, and hence, when the dropped negative potential is lowered to some extent, forward bias is formed between the P-type substrate and the deep N-type well NW, resulting in ultimately attaining the ground potential.

Furthermore, in the case where negative charge enters from the third antenna 208, the negative charge flows to the P-type substrate (ground potential) through the deep N-type well NW.

It is noted that the semiconductor protection circuit of this embodiment can be driven in the same manner as the semiconductor protection circuit of Embodiment 1 because the third antenna 208 is connected ultimately to a V-NW control circuit 112 (see FIG. 7).

As described so far, the semiconductor protection circuit of the present invention is used in a semiconductor device in which interconnects are driven by voltages changed from a positive voltage to a negative voltage, and in particular, it is useful as a word line protection circuit of a nonvolatile semiconductor memory in which a non-conductive charge trapping layer is used as a memory device.

What is claimed is:

1. A semiconductor protection circuit provided on a semiconductor substrate for protecting a semiconductor device including an interconnect from charge entering said interconnect during fabrication of said semiconductor device, comprising:
    a first metal interconnect connected to said interconnect and disposed on an upper layer than said interconnect;
    a forward diode having an input port connected to said interconnect;
    a backward diode that has an output port connected to said interconnect and is connected to said forward diode in parallel;
    an N-channel MIS transistor whose drain is connected to an output port of said forward diode, whose source is connected to said semiconductor substrate and whose gate electrode is grounded through a second metal interconnect disposed on an upper layer than said first metal interconnect;
    a P-channel MIS transistor whose drain is connected to an input port of said backward diode and whose source is connected to said semiconductor substrate;
    a first antenna connected to the gate electrode of said N-channel MIS transistor and disposed on the same interconnect layer as at least a part of said first metal interconnect; and
    a second antenna connected to a gate electrode of said P-channel MIS transistor and disposed on the same interconnect layer as at least a part of said first metal interconnect.

2. The semiconductor protection circuit of claim 1,
    wherein said semiconductor substrate is a P-type substrate,
    a deep N-type well is formed in said semiconductor substrate,
    a first N-type well, a second N-type well, a first P-type well and a second P-type well are formed in said deep N-type well,
    said forward diode is formed in said first N-type well,
    said backward diode is formed in said first P-type well,
    said N-channel MIS transistor is formed on said second P-type well, and
    said P-channel MIS transistor is formed on said second N-type well.

3. The semiconductor protection circuit of claim 2, further comprising:
    a first control circuit for controlling potential of the drain of said N-channel MIS transistor, the gate electrode of said P-channel MIS transistor and said second N-type well; and
    a second control circuit connected to the drain of said P-channel MIS transistor and the input port of said backward diode.

4. The semiconductor protection circuit of claim 3,
    wherein said semiconductor device is a nonvolatile semiconductor memory including a memory cell array in which a plurality of memory cells are arranged, each memory cell including a charge trapping layer for holding data and a gate electrode formed on said charge trapping layer; and an X decoder connected to said gate electrode of each memory cell through said interconnect, said interconnect is a word line, in a data write operation, said first control circuit applies, to the drain of said N-channel MIS transistor, the gate electrode of said P-channel MIS transistor and said second N-type well, a first voltage not less than a writing voltage applied to said interconnect, and said second control circuit applies, to the drain of said P-channel MIS transistor and the input port of said backward diode, a second voltage lower than said first voltage, and in a data delete operation, said first control circuit applies a third voltage to the drain of said N-channel MIS transistor, the gate electrode of said P-channel MIS transistor and said second N-type well, and said second control circuit applies, to the drain of said P-channel MIS transistor and the input port of the backward diode, a fourth voltage that is lower than said third voltage and is a negative voltage not more than a deleting voltage applied to said interconnect.

5. The semiconductor protection circuit of claim 1, wherein said interconnect is plural in number, said forward diode and said backward diode are respectively provided in number corresponding to the number of said interconnects, output ports of said plural forward diodes are connected to the drain of said N-channel MIS transistor common to said plural forward diodes, and input ports of said plural backward diodes are connected to the drain of said P-channel MIS transistor common to said plural backward diodes.

6. The semiconductor protection circuit of claim 1, further comprising a third antenna connected to the drain of said N-channel MIS transistor and the output port of said forward diode and provided on the same interconnect layer as said first antenna and said second antenna.

* * * * *